(12) United States Patent
Bhuwalka et al.

(10) Patent No.: US 9,093,273 B2
(45) Date of Patent: Jul. 28, 2015

(54) MULTIPLE-THRESHOLD VOLTAGE DEVICES AND METHOD OF FORMING SAME

(71) Applicant: Taiwan Semiconductor Manufacturing Company, Ltd., Hsin-Chu (TW)

(72) Inventors: Krishna Kumar Bhuwalka, Leuven (BE); Martin Christopher Holland, Bertem (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/975,010

(22) Filed: Aug. 23, 2013

(65) Prior Publication Data
US 2015/0054120 A1 Feb. 26, 2015

(51) Int. Cl.
*H01L 21/02* (2006.01)
*H01L 29/36* (2006.01)

(52) U.S. Cl.
CPC .... *H01L 21/02584* (2013.01); *H01L 21/02664* (2013.01); *H01L 29/36* (2013.01)

(58) Field of Classification Search
CPC ............... H01L 21/02584; H01L 21/02664
USPC .................. 257/201, 204, E21.634, E29.266; 438/231, 400
See application file for complete search history.

(56) References Cited

U.S. PATENT DOCUMENTS

| | | | | |
|---|---|---|---|---|
| 5,777,353 A | * | 7/1998 | Hsu et al. ....................... | 257/192 |
| 2011/0198707 A1 | * | 8/2011 | Ema et al. ....................... | 257/408 |
| 2013/0113026 A1 | * | 5/2013 | Huang et al. ................... | 257/288 |

FOREIGN PATENT DOCUMENTS

EP 2355154 A2 * 8/2011 ............ H01L 27/092

* cited by examiner

*Primary Examiner* — Selim Ahmed
*Assistant Examiner* — Changhyun Yi
(74) *Attorney, Agent, or Firm* — Slater & Matsil, L.L.P.

(57) ABSTRACT

A method comprises growing a channel layer over a substrate, wherein the channel layer comprises a first channel region and a second channel region, and wherein the first channel region and the second channel region are separated by a first isolation region, depositing a hard mask layer over the channel layer, patterning the hard mask layer, applying a first delta doping process to the first channel region to form a first delta doping layer over the first channel region, applying a second delta doping process to the second channel region to form a second delta doping layer over the second channel region, wherein the second delta doping layer is of a different doping density from the first delta doping layer and applying a diffusion process to the first delta doping layer and the second delta doping layer.

20 Claims, 15 Drawing Sheets

| P-TYPE DOPING MOCVD (NFET) IN III-V MATERIALS ||||||
|---|---|---|---|---|---|
| GROUP II |||| GROUP IV ||
| Be | Mg | Zn | Cd | C | Ge |
| DEBe ($C_2H_5Be$) | $Cp_2Mg$ ($Mg(C_2H_5)_2$), $MCp_2Mg$ ($Mg(C_2H_4\text{-}CH_3)_2$) | DMZn, DEZn | DMCd (($CH_3$)2Cd) | $CBr_4$, $CCl_4$, $CCl_3Br$ | $GeH_4$, $GeCL_4$ |

FIG. 29

| N-TYPE DOPING MOCVD (NFET) IN III-V MATERIALS |||||||
|---|---|---|---|---|---|---|
| GROUP IV |||| GROUP VI |||
| C | Si | Ge | Sn | Se | S | Se |
| $CBr_4$, $CCl_4$, $CCl_3Br$ | $SiH_4$, $SiCL_4$ | $GeH_4$, $GeCL_4$ | TESn, $Sn(CH_3)_4$ | DTBSe, $H_2Se$, $Se(CH3)2$ | $H_2S$, $S(C_4H_9)_2$ | DTBTe, $H_2Te$ $Te(CH_3)_2$ |

FIG. 30

MULTIPLE-THRESHOLD VOLTAGE DEVICES AND METHOD OF FORMING SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. With further advances in semiconductor technology, there has grown a need for transistors formed by III-V compound semiconductor materials to further improve the performance of electronic devices.

Compound semiconductor materials of group III and group V elements are good candidates for forming transistors due to their high electron mobility. A semiconductor region comprising a III-V compound material formed by group III and group V elements may be grown on a surface of a silicon substrate using an epitaxial growth process. The epitaxial growth process may be implemented using a metal organic chemical vapor deposition (MOCVD) process.

MOCVD is a semiconductor deposition technique for forming thin layers of atoms over a semiconductor wafer. MOCVD helps to grow a semiconductor layer with a precisely controlled thickness and a sharp doping profile. The process of growing such a precisely controlled doping layer is also known as a delta doping process.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 29 illustrates suitable doping materials for an n-type transistor in accordance with various embodiments of the present disclosure; and FIG. 30 illustrates suitable doping materials for a p-type transistor in accordance with various embodiments of the present disclosure.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a multiple-threshold voltage device formed of a III-V compound semiconductor material. The embodiments of the disclosure may also be applied, however, to a variety of semiconductor devices. Hereinafter, various embodiments will be explained in detail with reference to the accompanying drawings.

Figure 1:
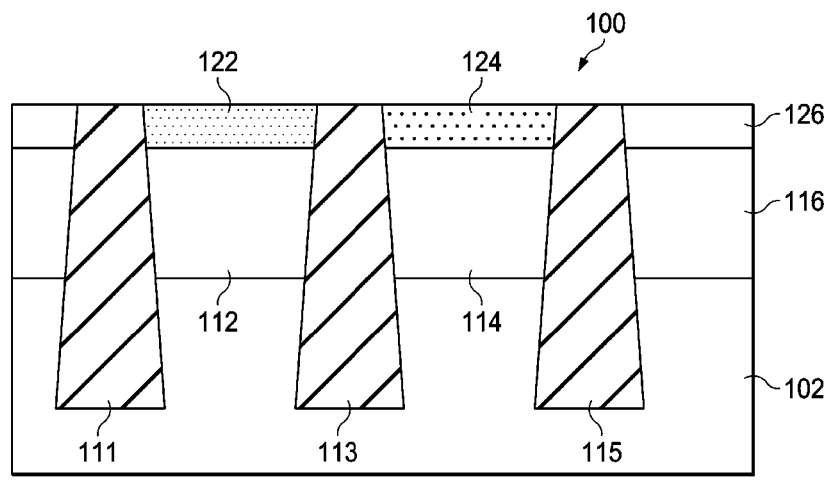
FIG. 1 illustrates a cross sectional view of a multiple-threshold voltage device in accordance with various embodiments of the present disclosure.

FIG. 1 illustrates a cross sectional view of a multiple-threshold voltage device in accordance with various embodiments of the present disclosure. The multiple-threshold voltage device 100 may comprise three transistors formed over a substrate 102. Each transistor is of a particular threshold voltage. For simplicity, FIG. 1 only illustrates the channel region of each transistor. As shown in FIG. 1, the channel regions include a first channel 122, a second channel 124 and a third channel 126. By selecting different doping levels at these three channels, the transistors of the multiple-threshold voltage device 100 may be of different threshold voltage levels. In some embodiments, the first channel 122 is of a standard threshold voltage (SVT). The second channel 124 is of a higher threshold voltage (HVT). The third channel 126 may be of a lower threshold voltage (LVT).

As shown in FIG. 1, the channels 122, 124 and 126 are separated from each other by a plurality of isolation regions. In particular, the first channel 122 is formed between a first isolation region 111 and a second isolation region 113. Likewise, the second channel 124 is formed between the second isolation region 113 and a third isolation region 115. Furthermore, the third isolation region 115 is employed to isolate the second channel 124 from the third channel 126.

FIG. 1 further illustrates a plurality of buffer regions formed between the substrate 102 and respective channel regions. As shown in FIG. 1, a first buffer region 112 is formed between the substrate 102 and the first channel 122. A second buffer region 114 is formed between the substrate 102 and the second channel 124. A third buffer region 116 is formed between the substrate 102 and the third channel 126.

In some embodiments, the substrate 102 may be a silicon substrate. Alternatively, the substrate 102 may comprise other semiconductor materials such as germanium, compound semiconductor materials such as silicon carbide, gallium arsenide, indium arsenide, indium phosphide, any combination thereof and/or the like. In accordance with some embodiments, the substrate 102 may be a crystalline structure. In accordance with alternative embodiments, the substrate 102 may be a silicon-on-insulator (SOI) substrate.

In accordance with some embodiments, the isolation region (e.g., first isolation region 111) may be implemented by using a shallow trench isolation (STI) structure. The STI structures (e.g., first isolation region 111) may be fabricated by using suitable techniques including photolithography and etching processes. In particular, the photolithography and etching processes may comprise depositing a commonly used mask material such as photoresist over the semiconductor device, exposing the mask material to a pattern and etching the semiconductor device in accordance with the pattern. In this manner, a plurality of openings may be formed as a result. The openings are then filled with dielectric materials to form the STI structures (e.g., first isolation region 111). A chemical mechanical polishing (CMP) process is then performed to remove excess portions of the dielectric materials, and the remaining portions are the isolation regions 111, 113 and 115.

The buffer regions 112, 114 and 116 may be formed of a different semiconductor material from the substrate 102. The buffer regions 112, 114 and 116 may be grown in an opening (not shown) surrounded by the isolation regions through an epitaxial growth process. In accordance with some embodiments, the buffer regions 112, 114 and 116 may be formed of a compound semiconductor material comprising group III and group V elements.

In some embodiments, the buffer regions 112, 114 and 116 are formed of suitable semiconductor materials such as Aluminum Arsenide Antimonide (AlAsSb), Indium Aluminum Arsenide (InAlAs), Indium Phosphide (InP) and/or the like. In some embodiments, the buffer regions 112, 114 and 116 may be of a thickness in a range from about 100 nm to about 500 nm.

The channels 122, 124 and 126 may be formed of a different semiconductor material from the substrate 102. The channels 122, 124 and 126 may be formed through another epitaxial growth process. In accordance with some embodiments, the channels 122, 124 and 126 may be formed of a compound semiconductor material comprising group III and group V elements. In some embodiments, the channels 122, 124 and 126 are formed of suitable semiconductor materials such as Indium Arsenide (InAs), Indium Gallium Arsenide (InGaAs), Gallium Antimonide (GaSb) and/or the like. In some embodiments, the channels 122, 124 and 126 may be of a thickness in a range from about 5 nm to about 20 nm.

It should be noted while FIG. 1 shows a semiconductor device including a plurality of planar transistors, the fabrication process for forming a multiple-threshold voltage device may be applicable to three-dimensional transistors such as FinFETs. The detailed fabrication process of a multiple-threshold voltage FinFET semiconductor device will be described below with respect to FIGS. 11-19.

Figure 2:
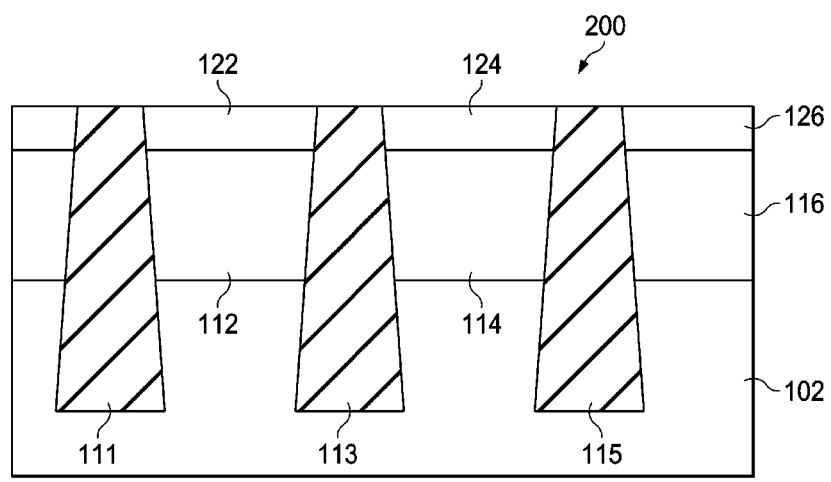
FIG. 2 illustrates a cross sectional view of a semiconductor device in accordance with various embodiments of the present disclosure.

FIGS. 2-10 illustrates intermediate steps of fabricating the multiple-threshold voltage device shown in FIG. 1 in accordance with various embodiments of the present disclosure. FIG. 2 illustrates a cross sectional view of a semiconductor device in accordance with various embodiments of the present disclosure. The semiconductor device 200 is similar to the multiple-threshold voltage device 100 shown in FIG. 1 except that the channels 122, 124 and 126 in FIG. 2 are of a same doping density. The substrate 102, the isolation regions (e.g., the first isolation region 111) and the buffer regions (e.g., the first buffer region 112) have been described in detail above with respect to FIG. 1, and hence are not described again to avoid unnecessary repetition.

Figure 3:
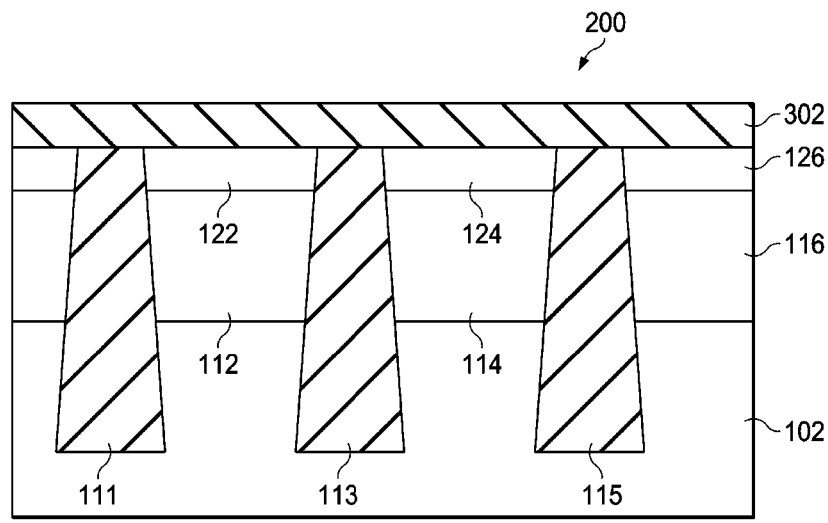
FIG. 3 illustrates a cross sectional view of the semiconductor device shown in FIG. 2 after a hard mask layer is deposited over the semiconductor device in accordance with various embodiments of the present disclosure.

FIG. 3 illustrates a cross sectional view of the semiconductor device shown in FIG. 2 after a hard mask layer is deposited over the semiconductor device in accordance with various embodiments of the present disclosure. In an embodiment, the hard mask layer 302 comprises suitable materials such as an oxide or a nitride, such as silicon oxide, silicon oxynitride, silicon nitride and/or the like.

The hard mask layer 302 is deposited over the top surface of the semiconductor device 200 via a suitable deposition technique such as low pressure chemical vapor deposition (LPCVD), plasma enhanced chemical vapor deposition (PECVD) and/or the like. The hard mask layer 302 may be of a thickness in a range from about 200 Å to about 1400 Å. While FIG. 3 illustrates a single hard mask layer, a multi-layer hard mask, such as layers of silicon dioxide and silicon nitride, may also be used. Furthermore, other materials, such as a metal, a metal nitride, a metal oxide, or the like, may be used.

Figure 4:
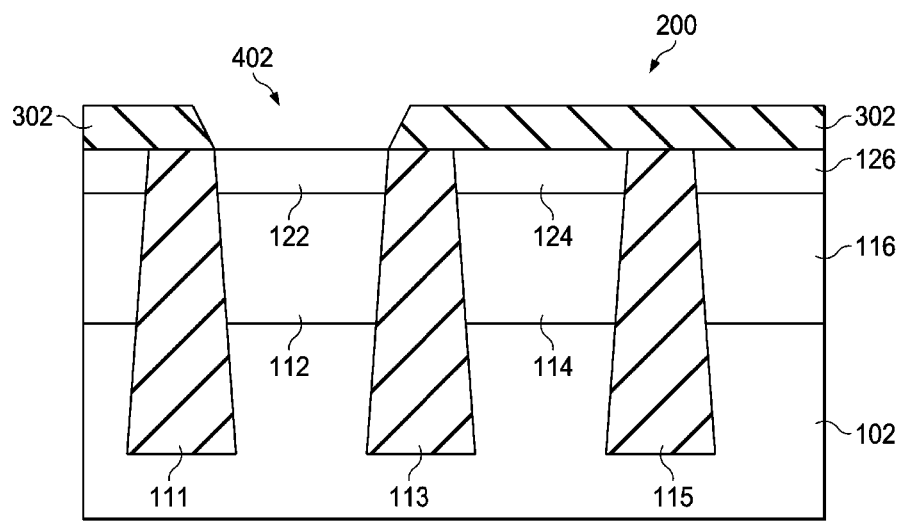
FIG. 4 illustrates a cross sectional view of the semiconductor device shown in FIG. 2 after a patterning process is applied to the semiconductor device in accordance with various embodiments of the present disclosure.

FIG. 4 illustrates a cross sectional view of the semiconductor device shown in FIG. 3 after a patterning process is applied to the semiconductor device in accordance with various embodiments of the present disclosure. In consideration of the location of the first channel 122, a selective area of the hard mask layer 302 is removed and an opening 402 is formed as shown in FIG. 4. The formation of the opening 402 in the hard mask layer 302 involves lithography operations, which are well known, and hence are not discussed in further detail herein.

Figure 5:
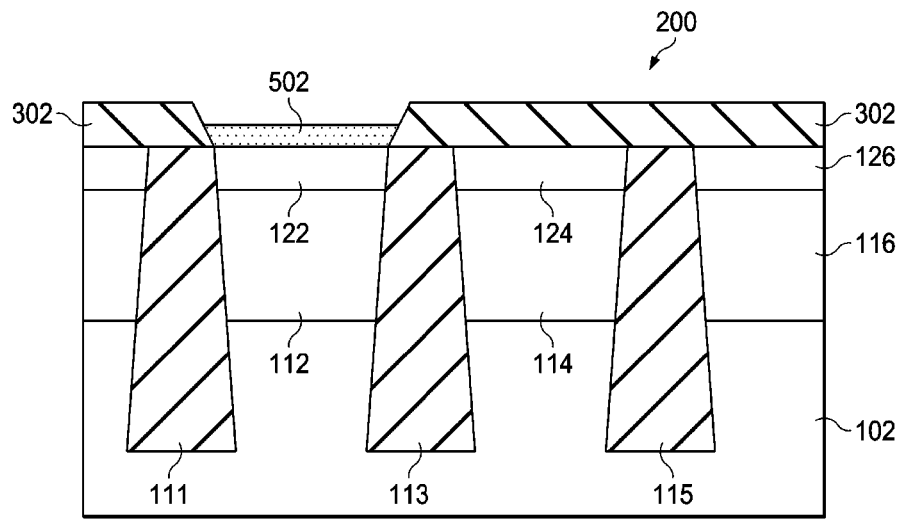
FIG. 5 illustrates a cross sectional view of the semiconductor device shown in FIG. 4 after a first delta doping process is applied to the semiconductor device in accordance with various embodiments of the present disclosure.

FIG. 5 illustrates a cross sectional view of the semiconductor device shown in FIG. 4 after a first delta doping process is applied to the semiconductor device in accordance with various embodiments of the present disclosure. In some embodiments, the first delta doping process is implemented through a metal organic chemical vapor deposition (MOCVD) process. After the MOCVD process is applied to the top surface of the first channel 122, a monolayer 502 is formed over the first channel 122. Throughout the description, the monolayer 502 is alternatively referred to as a first delta doping layer 502.

In some embodiments, if the transistor with the first channel 122 is an n-type transistor, p-type dopants may be employed in the MOCVD process. On the other hand, if the transistor with the first channel 122 is a p-type transistor, n-type dopants may be employed in the MOCVD process. The exemplary embodiments of p-type doping materials and n-type doping materials are illustrated below with respect to FIG. 29 and FIG. 30 respectively.

In some embodiments, the doping density of the first delta doping layer 502 is about $1e13/cm^2$. Alternatively, the doping density of the first delta doping layer 502 may be in a range from about $1e12/cm^2$ to about $1e15/cm^2$. The temperature of the MOCVD process is in a range from about 400 degrees to about 600 degrees under a pressure level of about 100 mbar. The deposition time may be in a range from about 5 seconds to about 30 minutes. The dopant flow rate of the MOCVD process is in a range from about 10 sccm to about 500 sccm.

It should be noted that the doping density, the deposition temperature, the deposition time and the dopant flow rate used herein are selected purely for demonstration purposes and are not intended to limit the various embodiments of the present disclosure to any particular limitation described above.

One advantageous feature of forming the first delta doping layer via a MOCVD process is that the MOCVD process is a low temperature growth process. Such a low temperature growth process may satisfy the low temperature requirements of semiconductor devices formed by III-V compound semiconductor materials.

Figure 6:
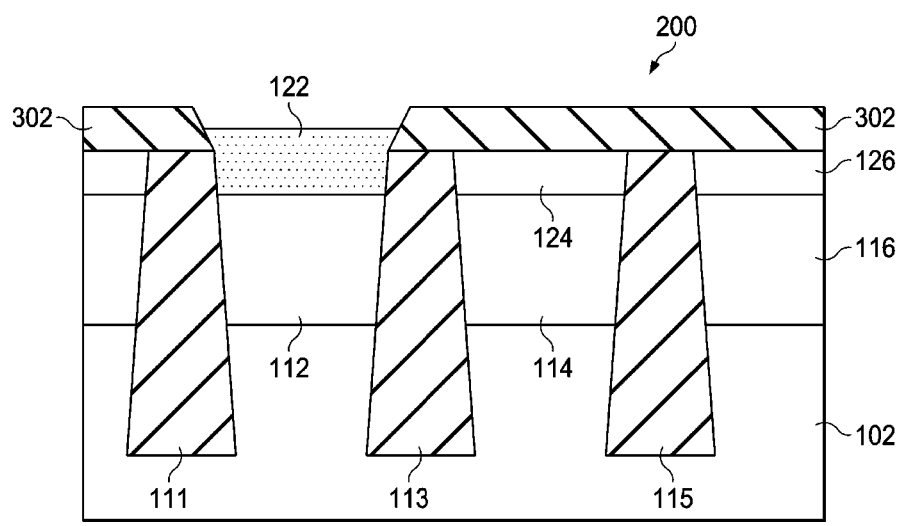
FIG. 6 illustrates a cross sectional view of the semiconductor device shown in FIG. 5 after a first diffusion process is applied to the semiconductor device in accordance with various embodiments of the present disclosure.

FIG. 6 illustrates a cross sectional view of the semiconductor device shown in FIG. 5 after a first diffusion process is applied to the semiconductor device in accordance with various embodiments of the present disclosure. The dopants of the first delta doping layer 502 may be diffused into the first channel 122 as well as the first buffer region 112 through a semiconductor diffusion process.

After the first diffusion process is applied to the semiconductor device 200, the doping density is inversely proportional to the doping depth in the channel and the buffer region. In other words, in the region adjacent to the top surface of the first channel 122, the doping density is higher. On the other hand, the doping density drops with depth. In some embodiments, the doping density in the first channel 122 is about $1e14/cm^2$. The doping density in the first buffer region 112 is about $1e11/cm^2$.

The process temperature of the semiconductor diffusion process is in a range from about 400 degrees to about 800 degrees. In some embodiments, when the process temperature is about 600 degrees, the diffusion time is about 20 seconds.

Figure 7:
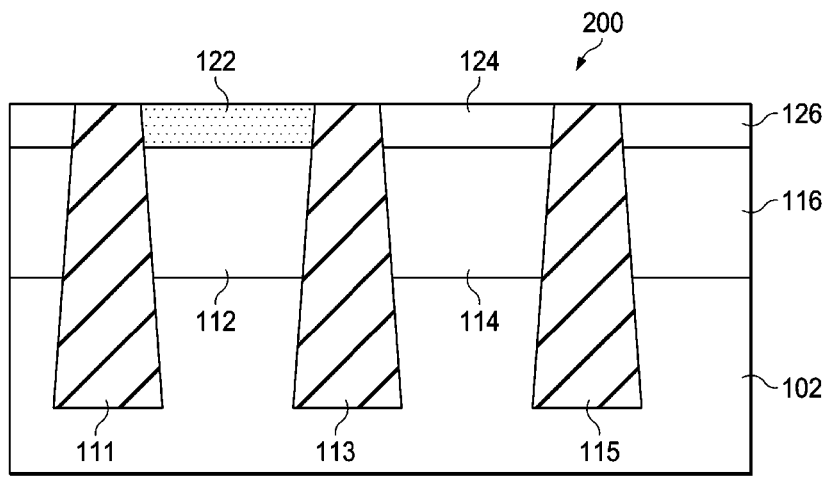
FIG. 7 illustrates a cross sectional view of the semiconductor device shown in FIG. 6 after a hard mask removal process is applied to the semiconductor device in accordance with various embodiments of the present disclosure.

FIG. 7 illustrates a cross sectional view of the semiconductor device shown in FIG. 6 after a hard mask removal process is applied to the semiconductor device in accordance with various embodiments of the present disclosure. The hard mask may be removed using, for example, a chemical mechanical polishing process (CMP) or other suitable processes (e.g., etching processes).

In the CMP process, a combination of etching materials and abrading materials are put into contact with the hard mask layer 302 and a grinding pad (not shown) is used to grind away the hard mask layer 302 until the top surfaces of the isolation regions (e.g., first isolation region 111) are exposed.

Figure 8:
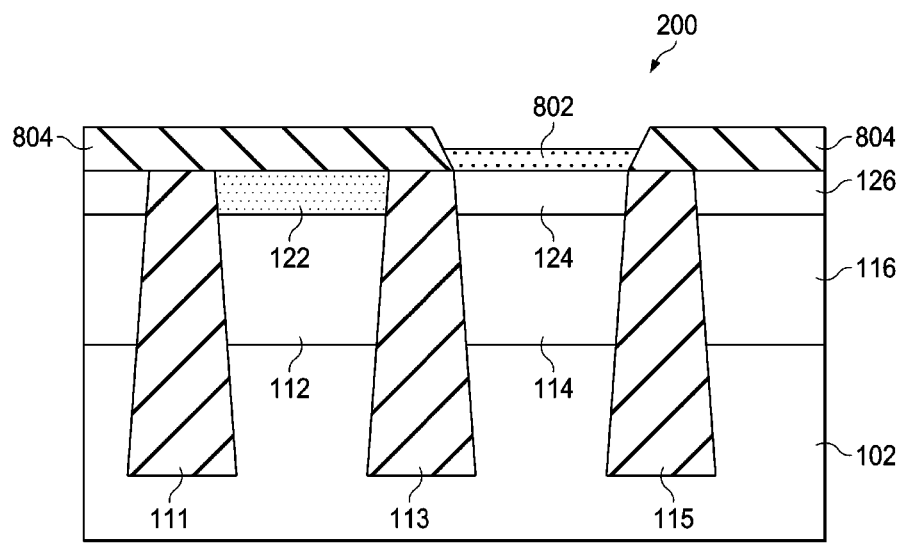
FIG. 8 illustrates a cross sectional view of the semiconductor device shown in FIG. 7 after a second delta doping layer is formed in the semiconductor device in accordance with various embodiments of the present disclosure.

FIG. 8 illustrates a cross sectional view of the semiconductor device shown in FIG. 7 after a second delta doping layer is formed in the semiconductor device in accordance with various embodiments of the present disclosure. The fabrication steps such as depositing a hard mask layer and patterning the hard mask layer are similar to the fabrication steps shown in FIGS. 3-4, and hence are not discussed herein to avoid repetition.

The formation process of the second delta doping layer 802 is similar to that of the first delta doping layer 502 shown in FIG. 5, and hence is not discussed herein to avoid repetition.

It should be noted that, in order to have a different threshold voltage at the second channel 124, the second delta doping layer 802 may be of a different doping density. In some embodiments, the doping density of the second delta doping layer 802 is greater than the doping density of the first delta doping layer 502. Such a higher doping density helps to form a higher threshold voltage at the second channel 124.

Figure 9:
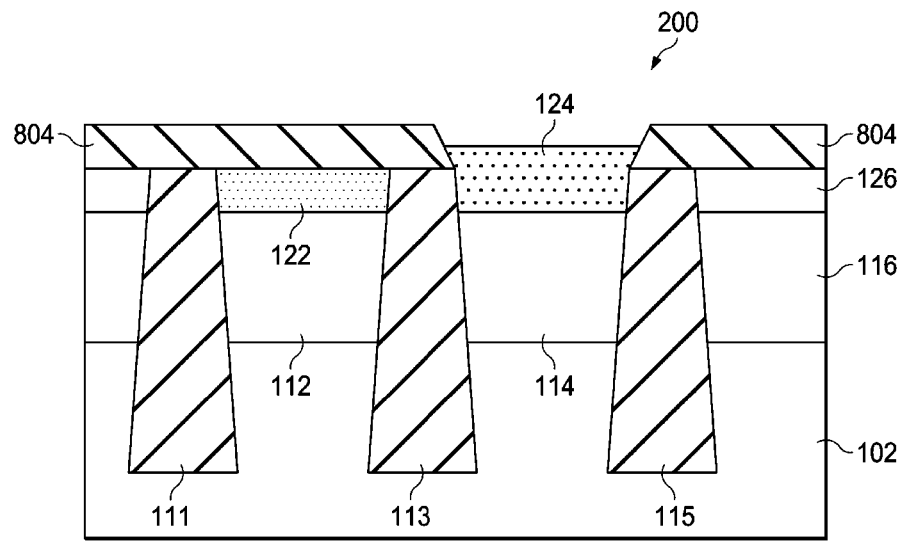
FIG. 9 illustrates a cross sectional view of the semiconductor device shown in FIG. 8 after a second diffusion process is applied to the semiconductor device in accordance with various embodiments of the present disclosure.

FIG. 9 illustrates a cross sectional view of the semiconductor device shown in FIG. 8 after a second diffusion process is applied to the semiconductor device in accordance with various embodiments of the present disclosure. The dopants of the second delta doping layer 802 may be diffused into the second channel 124 as well as the second buffer region 114 through a semiconductor diffusion process.

After the diffusion process is applied to the semiconductor device, the doping density is inversely proportional to the doping depth in the channel and the buffer region. In other words, in the region adjacent to the top surface of the second channel 124, the doping density is higher. On the other hand, the doping density drops with depth. The process temperature of the semiconductor diffusion process is in a range from about 400 degrees to about 800 degrees. In some embodiments, when the process temperature is about 600 degrees, the diffusion time is about 20 seconds.

Figure 10:
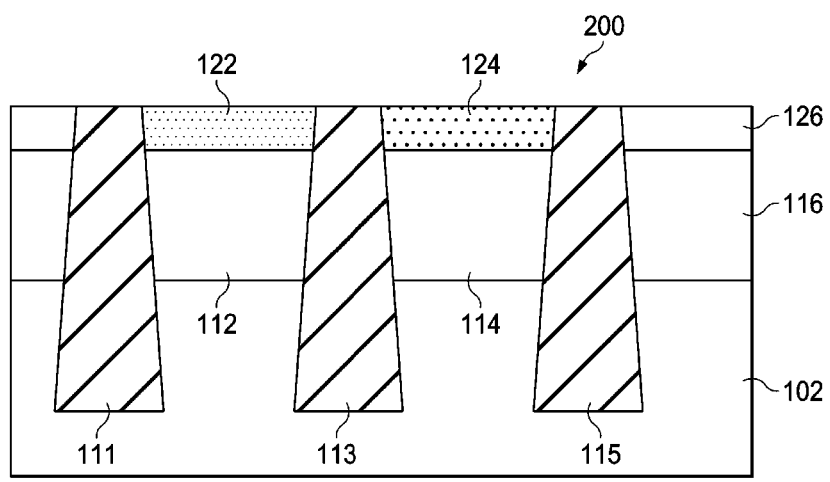
FIG. 10 illustrates a cross sectional view of the semiconductor device shown in FIG. 9 after a hard mask removal process is applied to the semiconductor device in accordance with various embodiments of the present disclosure.
Figure 11:
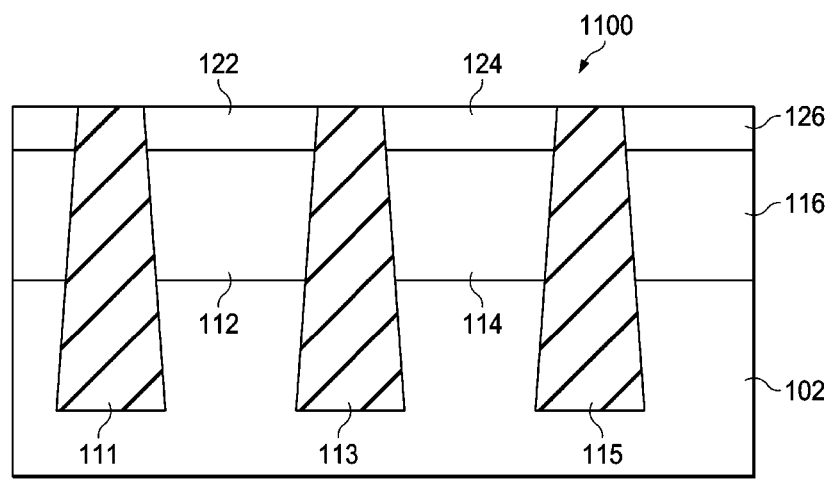
FIGS. 11-19 illustrate intermediate steps of fabricating another multiple-threshold voltage device in accordance with various embodiments of the present disclosure.
Figure 12:
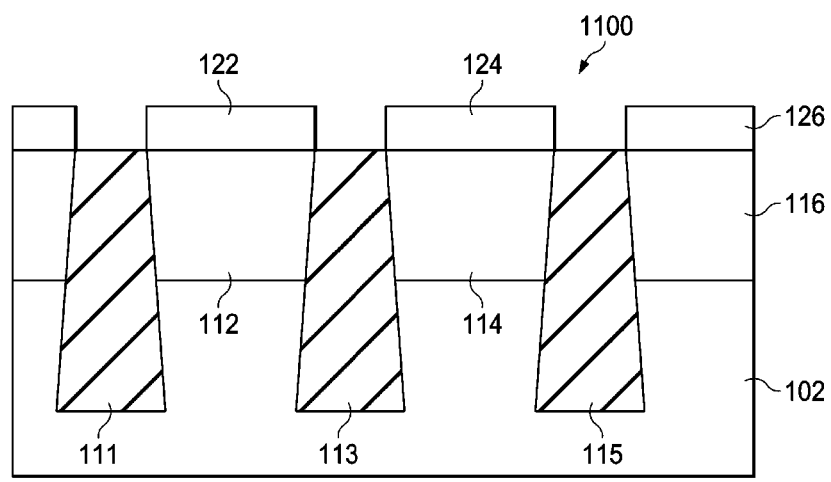
Figure 13:
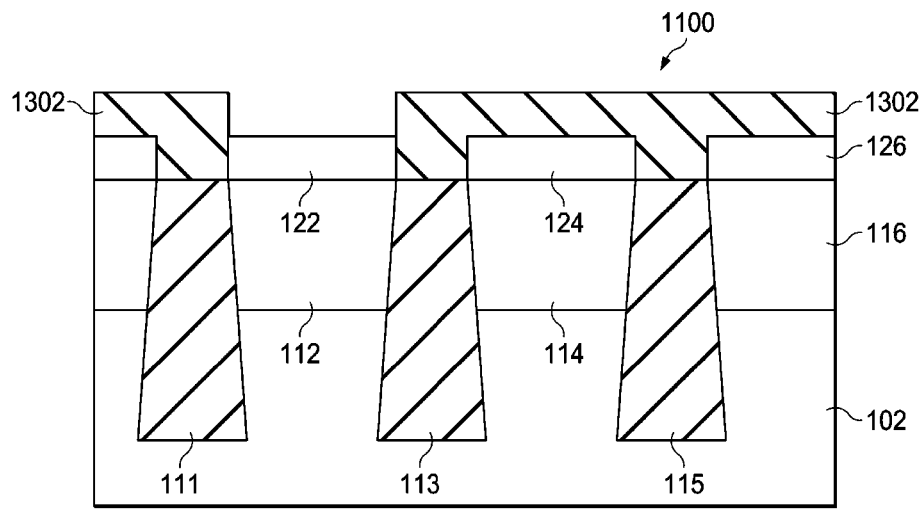
Figure 14:
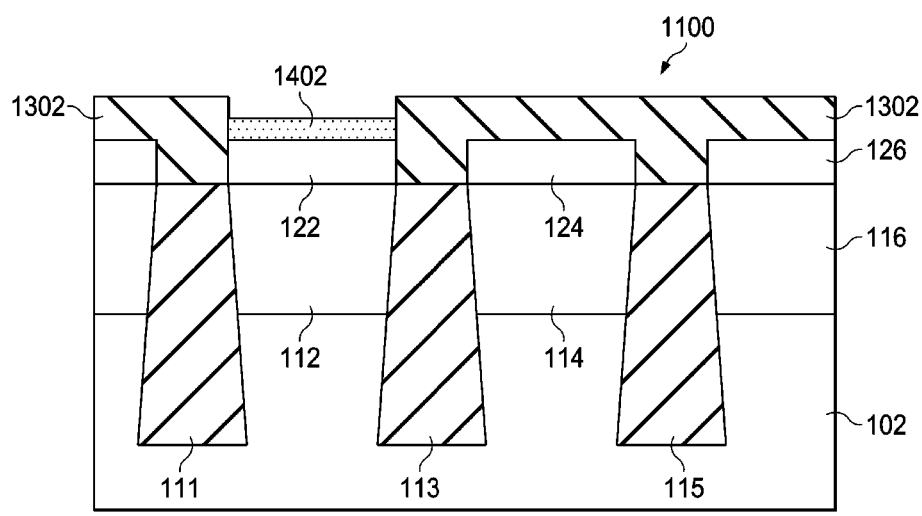
Figure 15:
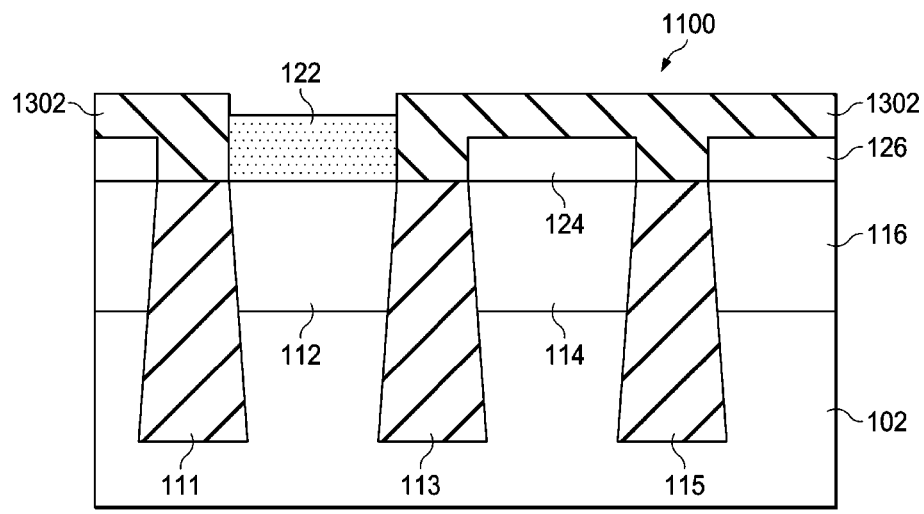
Figure 16:
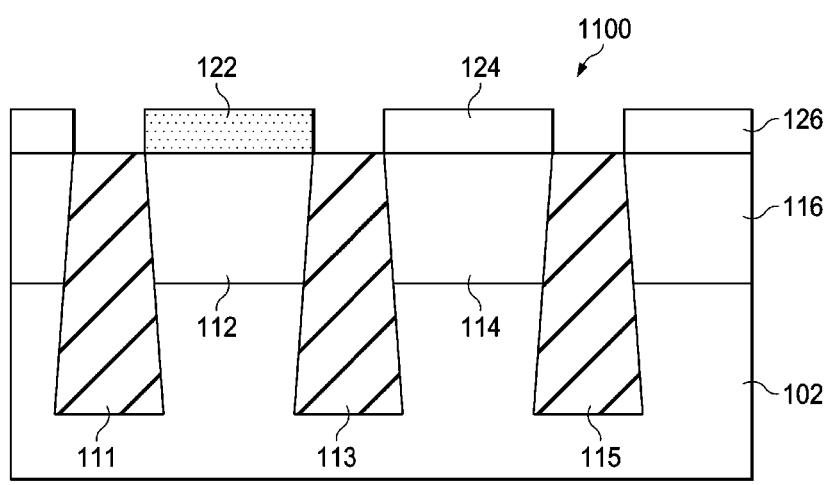
Figure 17:
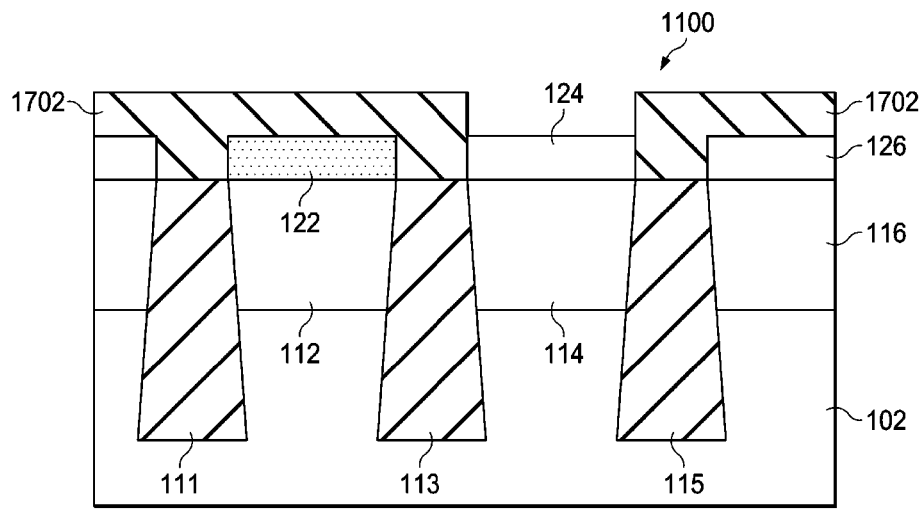
Figure 18:
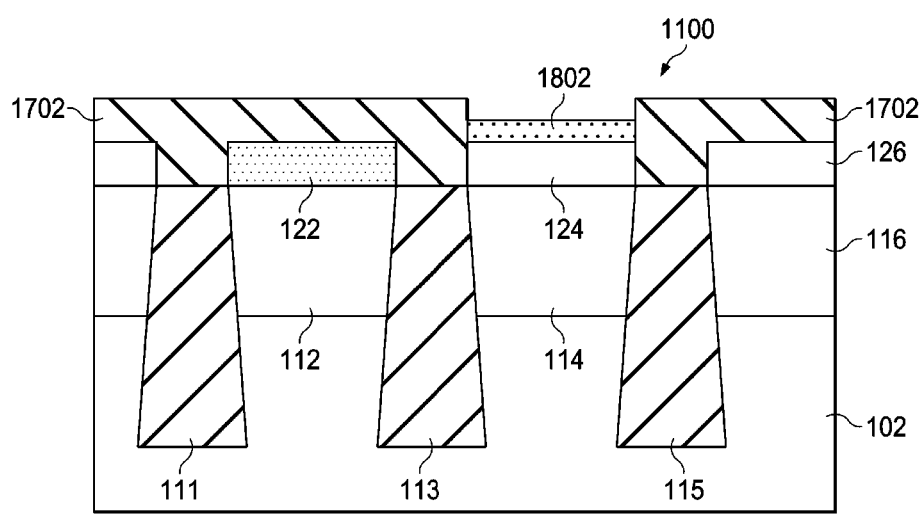
Figure 19:
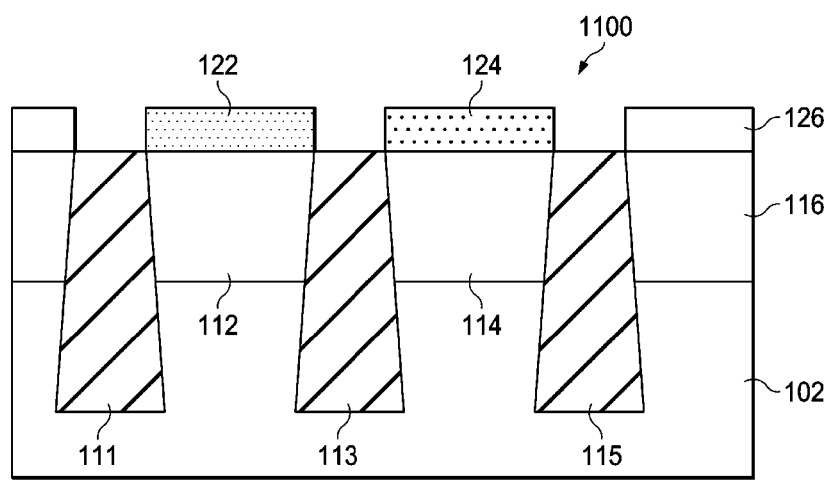
Figure 20:
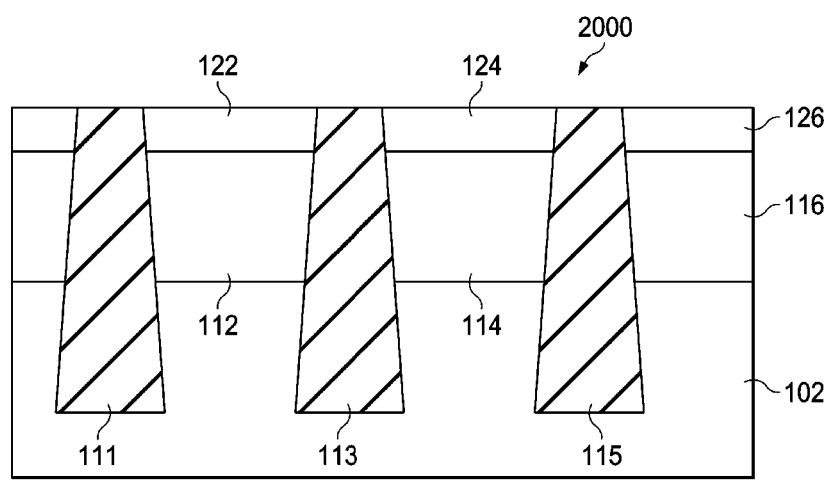
FIGS. 20-28 illustrate intermediate steps of fabricating the multiple-threshold voltage device shown in FIG. 1 in accordance with another embodiment of the present disclosure.
Figure 21:
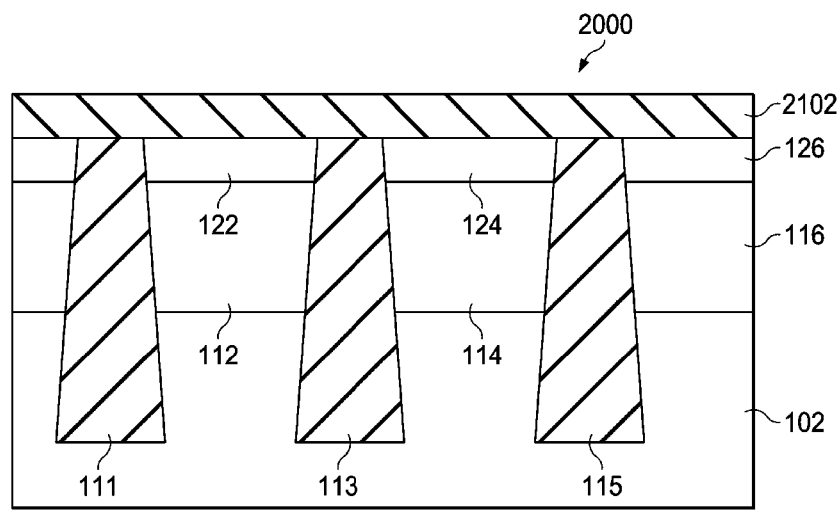
Figure 22:
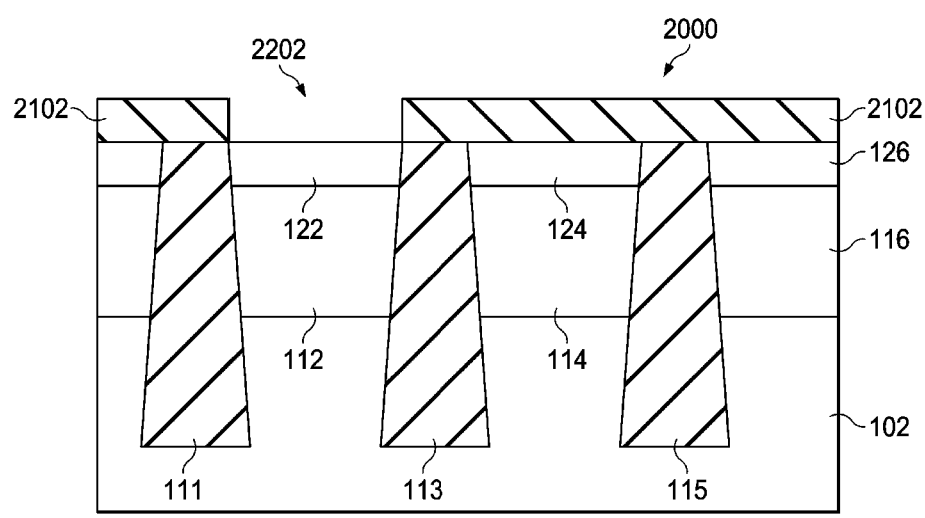

FIG. 10 illustrates a cross sectional view of the semiconductor device shown in FIG. 9 after a hard mask removal process is applied to the semiconductor device in accordance with various embodiments of the present disclosure. The hard mask layer 804 may be removed using, for example, a chemical mechanical polishing process (CMP) or other suitable processes (e.g., etching processes).

As shown in FIG. 10, there may be three transistors in the semiconductor device 200. These three transistors comprise the first channel 122, the second channel 124 and the third channel 126 respectively. In some embodiments, the first channel 122 is of a standard threshold voltage. The second channel 124 is of a higher threshold voltage. The third channel 126 is of a lower threshold voltage.

FIGS. 11-19 illustrate intermediate steps of fabricating another multiple-threshold voltage device in accordance with various embodiments of the present disclosure. The fabrication steps shown in FIGS. 11-19 are similar to the fabrication steps shown in FIGS. 2-10 except that in FIG. 12, there may be a plurality of FinFETs formed over the substrate 102. More particularly, the formation of fins of a FinFET may include recessing the semiconductor device to form recesses, filling the recesses with a dielectric material, performing a chemical mechanical polish process to remove excess portions of the dielectric material above the channel regions, and recessing a top layer of the dielectric material so that the channel regions 122, 124 and 126 are protruding over the top surfaces of the semiconductor device 1100.

FIGS. 20-28 illustrate intermediate steps of fabricating the multiple-threshold voltage device shown in FIG. 1 in accordance with another embodiment of the present disclosure. The fabrication steps shown in FIGS. 20-23 are similar to the fabrication steps shown in FIGS. 2-5, and hence are not discussed herein to avoid repetition.

Figure 23:
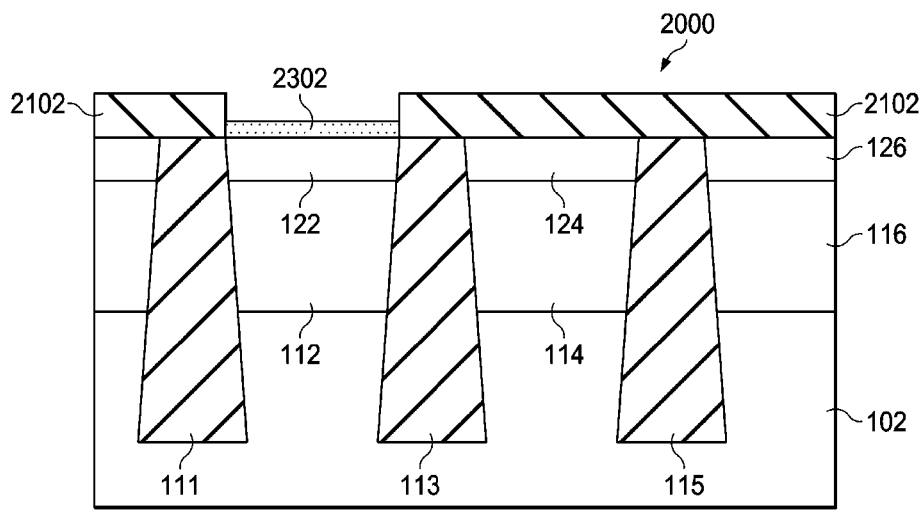
Figure 24:
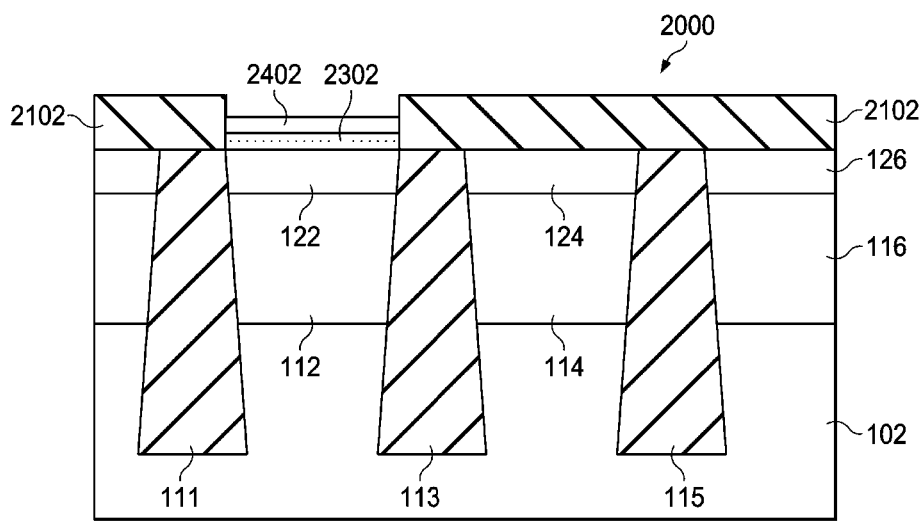

FIG. 24 illustrates a cross sectional view of the semiconductor device shown in FIG. 23 after a first cap layer 2402 is deposited over the first delta doping layer 2302 in accordance with various embodiments of the present disclosure. The first cap layer 2402 may be formed by a selective epitaxial growth (SEG) process. The first cap layer 2402 may be formed of a material similar to the first channel 122. In addition, the first cap layer 2402 may be of a thickness in a range from about 1 nm to about 5 nm.

Figure 25:
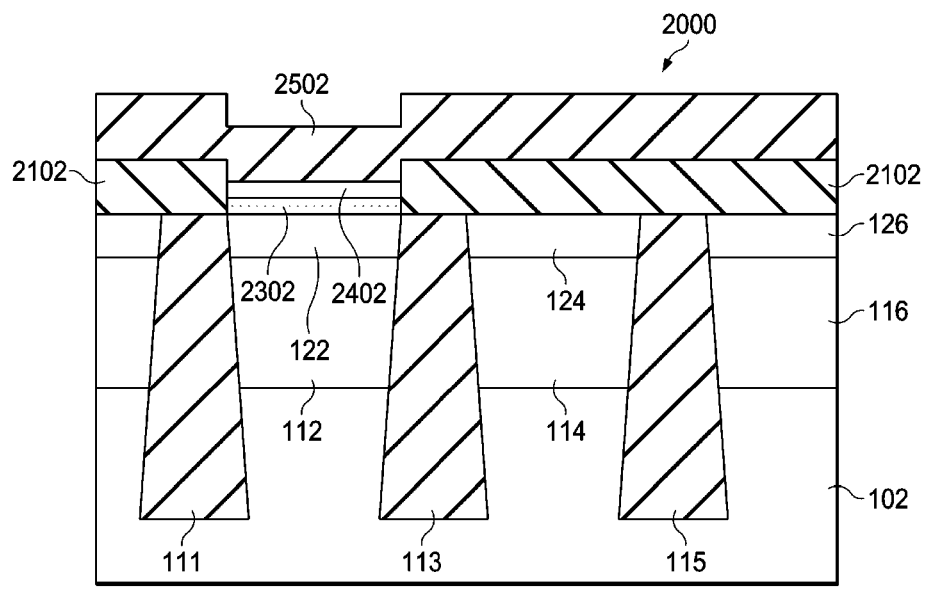

FIG. 25 illustrates a cross sectional view of the semiconductor device shown in FIG. 24 after a second hard mask layer is deposited over the semiconductor device in accordance with various embodiments of the present disclosure. In an embodiment, the second hard mask layer 2502 comprises a material similar to the first hard mask layer 2102. The second hard mask layer 2502 may be deposited via suitable deposition processes such as LPCVD, PECVD and/or the like.

Figure 26:
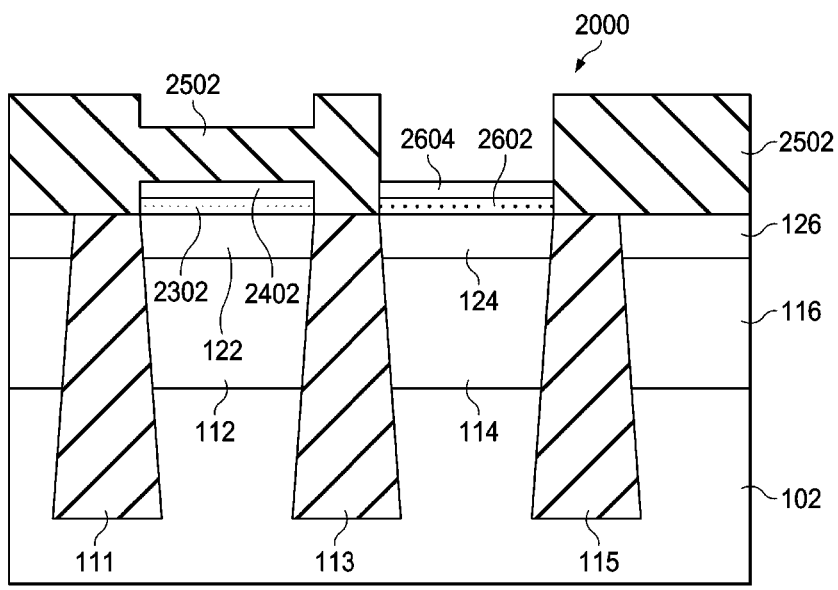

FIG. 26 illustrates a cross sectional view of the semiconductor device shown in FIG. 25 after a second cap layer is deposited over the second delta doping layer in accordance with various embodiments of the present disclosure. The detailed fabrication process of forming the second delta doping layer 2602 and the second cap layer 2604 is similar to that of the first delta doping layer 2302 and the first cap layer 2402, and hence is not discussed herein to avoid repetition.

Figure 27:
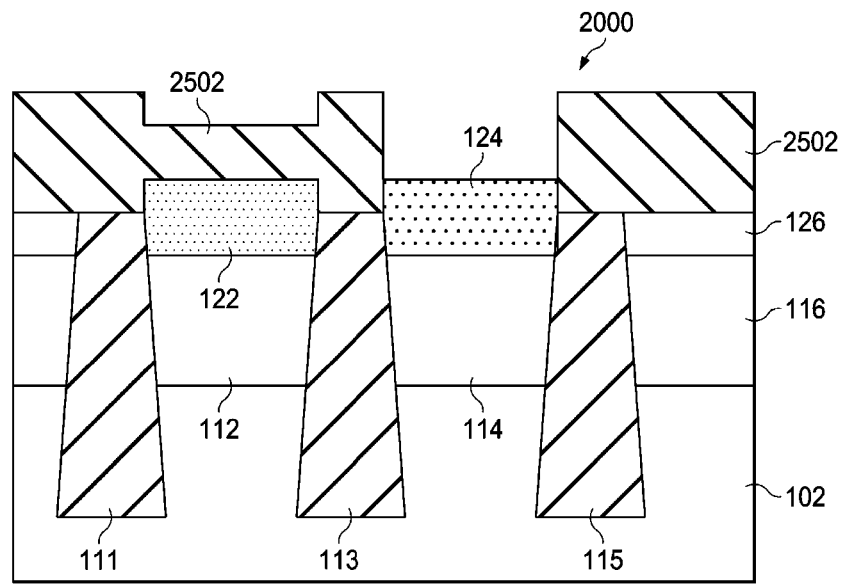

FIG. 27 illustrates a cross sectional view of the semiconductor device shown in FIG. 26 after a diffusion process is applied to the semiconductor device in accordance with various embodiments of the present disclosure. The dopants of the first delta doping layer 2302 and the second delta doping layer 2602 may be diffused into the first channel 122 and the second channel 124 respectively through a semiconductor diffusion process.

After the diffusion process is applied to the semiconductor device, the doping density is inversely proportional to the doping depth in the channels and the buffer regions. For example, in the region adjacent to the top surface of the channels (e.g., first channel 122), the doping density is higher. On the other hand, the doping density drops with depth.

Figure 28:
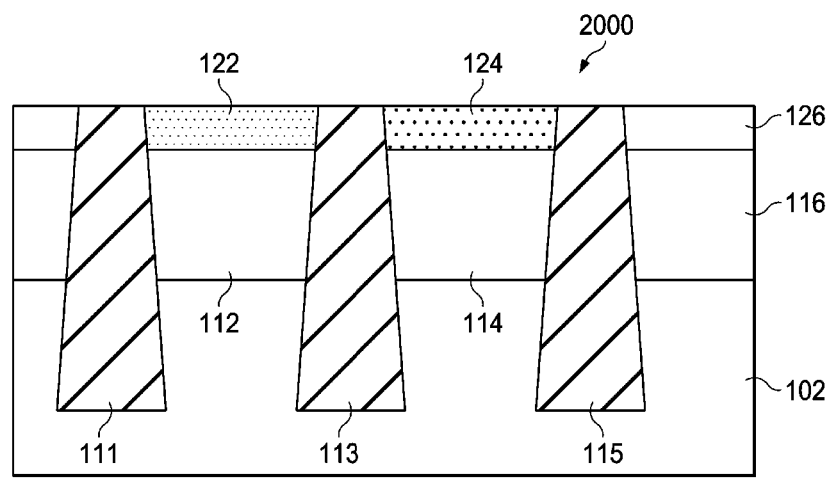

FIG. 28 illustrates a cross sectional view of the semiconductor device shown in FIG. 27 after a hard mask removal process is applied to the semiconductor device in accordance with various embodiments of the present disclosure. The hard mask may be removed using, for example, a CMP process or other suitable processes such as etching processes.

FIG. 29 illustrates suitable doping materials for an n-type transistor in accordance with various embodiments of the present disclosure. In some embodiments, the semiconductor device (e.g., multiple-threshold voltage device 100 shown in FIG. 1) is a III-V semiconductor device including a plurality of n-type transistors. P-type doping materials are doped into the channel of the n-type transistors. The suitable p-type doping materials are illustrated in FIG. 29.

It should be noted that materials included in the table of FIG. 29 are merely an example, which should not unduly limit the scope of the claims. One of ordinary skill in the art would recognize many variations, alternatives, and modifications.

FIG. 30 illustrates suitable doping materials for a p-type transistor in accordance with various embodiments of the present disclosure. In some embodiments, the semiconductor device (e.g., multiple-threshold voltage device 100 shown in FIG. 1) is a III-V semiconductor device including a plurality of p-type transistors. N-type doping materials are doped into the channel of the p-type transistors. The suitable n-type doping materials are illustrated in FIG. 30.

It should be noted that materials included in the table of FIG. 30 are merely an example, which should not unduly limit the scope of the claims. One of ordinary skill in the art would recognize many variations, alternatives, and modifications.

In accordance with an embodiment, a method comprises growing a channel layer over a substrate, wherein the channel layer comprises a first channel region and a second channel region, and wherein the first channel region and the second channel region are separated by a first isolation region, depositing a hard mask layer over the channel layer, patterning the hard mask layer, applying a first delta doping process to the first channel region to form a first delta doping layer over the first channel region, applying a second delta doping process to the second channel region to form a second delta doping layer over the second channel region, wherein the second delta doping layer is of a different doping density from the first delta doping layer and applying a diffusion process to the first delta doping layer and the second delta doping layer.

In accordance with an embodiment, a method comprises providing a substrate, growing a buffer layer over the substrate through a first epitaxial growth process, growing a channel layer over the buffer layer through a second epitaxial growth process and forming a plurality of isolation regions, wherein the isolation regions divide the channel layer into a first channel region, a second channel region and a third channel region and the isolation regions divide the buffer layer into a first buffer region, a second buffer region and a third buffer region.

The method further comprises applying a first delta doping process to the first channel region to form a first delta doping layer over the first channel region, applying a second delta doping process to the second channel region to form a second delta doping layer over the second channel region, wherein the second delta doping layer is of a different doping density from the first delta doping layer, diffusing first dopants from the first delta doping layer into the first channel region and the first buffer region and diffusing second dopants from the second delta doping layer into the second channel region and the second buffer region.

In accordance with an embodiment, an apparatus comprises a first buffer region formed over a substrate, a first channel region formed over the first buffer region, wherein the first channel region is of a first threshold voltage, a second buffer region formed over the substrate, a second channel region formed over the second buffer region, wherein the second channel region and the first channel region are separated from each other by a first isolation region and the second channel region is of a second threshold voltage.

The apparatus further comprises a third buffer region formed over the substrate, a third channel region formed over the third buffer region, wherein the third channel region and the second channel region are separated from each other by a second isolation region and the third channel region is of a third threshold voltage, and wherein the first channel region, the second channel region and the third channel region are formed of compound semiconductor materials of group III and group V elements.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   growing a channel layer over a substrate, wherein the channel layer comprises:
   a first channel region; and
   a second channel region, and wherein the first channel region and the second channel region are separated by a first isolation region;
   depositing a hard mask layer over the channel layer;

patterning the hard mask layer;
applying a first delta doping process to the first channel region to form a first delta doping layer over the first channel region, wherein a top surface of the first delta doping layer is exposed and a bottom surface of the first delta doping layer is in direct contact with a top surface of the first channel region;
applying a second delta doping process to the second channel region to form a second delta doping layer over the second channel region, wherein the second delta doping layer is of a different doping density from the first delta doping layer, and wherein a top surface of the second delta doping layer is exposed and a bottom surface of the second delta doping layer is in direct contact with a top surface of the second channel region; and
after the step of applying the first delta doping process and prior to the step of applying the second delta doping, applying a first diffusion process to the first delta doping layer and after the step of applying the first delta doping process, applying a second diffusion process to the second delta doping layer.

2. The method of claim 1, further comprising:
growing a buffer layer over the substrate, wherein the buffer layer is formed between the substrate and the channel layer.

3. The method of claim 2, wherein:
the substrate is formed of silicon;
the buffer layer is formed of aluminum arsenide antimonide; and
the channel layer is formed of indium arsenide.

4. The method of claim 2, wherein:
the buffer layer is of a thickness in a range from about 100 nm to about 500 nm.

5. The method of claim 1, further comprising:
patterning the hard mask layer to expose the first channel region;
applying the first delta doping process to the first channel region to form the first delta doping layer over the first channel region;
applying the first diffusion process to the first delta doping layer;
removing the hard mask layer;
depositing a second hard mask layer over the channel layer;
patterning the second hard mask layer to expose the second channel region;
applying the second delta doping process to the second channel region to form the second delta doping layer over the second channel region;
applying the second diffusion process to the second delta doping layer; and
removing the second hard mask layer.

6. The method of claim 1, further comprising:
patterning the hard mask layer to expose the first channel region;
applying the first delta doping process to the first channel region to form the first delta doping layer over the first channel region;
depositing a first cap layer over the first delta doping layer;
depositing a second hard mask layer over the channel layer, wherein the first cap layer is embedded in the second hard mask layer;
patterning the second hard mask layer to expose the second channel region;
applying the second delta doping process to the second channel region to form the second delta doping layer over the second channel region;
depositing a second cap layer over the second delta doping layer; and
applying the diffusion process to the first delta doping and the second delta doping layer.

7. The method of claim 1, further comprising:
recessing the first isolation region until a bottom surface of the channel layer is level with a top surface of the first isolation region;
depositing a first hard mask layer over the channel layer and the top surface of the first isolation region;
patterning the first hard mask layer to expose the first channel region;
applying the first delta doping process to the first channel region to form the first delta doping layer over the first channel region;
applying the first diffusion process to the first delta doping layer;
removing the first hard mask layer;
depositing a second hard mask layer over the channel layer and the top surface of the first isolation region;
patterning the second hard mask layer to expose the second channel region;
applying the second delta doping process to the second channel region to form the second delta doping layer over the second channel region;
applying the second diffusion process to the second delta doping layer; and
removing the second hard mask layer.

8. A method comprising:
providing a substrate;
growing a buffer layer over the substrate through a first epitaxial growth process;
growing a channel layer over the buffer layer through a second epitaxial growth process;
forming a plurality of isolation regions, wherein:
the isolation regions divide the channel layer into a first channel region, a second channel region and a third channel region; and
the isolation regions divide the buffer layer into a first buffer region, a second buffer region and a third buffer region;
applying a first delta doping process to the first channel region to form a first delta doping layer over the first channel region, wherein a top surface of the first delta doping layer is exposed and a bottom surface of the first delta doping layer is in direct contact with a top surface of the first channel region;
applying a second delta doping process to the second channel region to form a second delta doping layer over the second channel region, wherein the second delta doping layer is of a different doping density from the first delta doping layer, and wherein a top surface of the second delta doping layer is exposed and a bottom surface of the second delta doping layer is in direct contact with a top surface of the second channel region;
after the step of applying the first delta doping process and prior to the step of applying the second delta doping, diffusing first dopants from the first delta doping layer into the first channel region and the first buffer region; and
after the step of applying the second delta doping, diffusing second dopants from the second delta doping layer into the second channel region and the second buffer region.

9. The method of claim 8, further comprising:
recessing the isolation regions to form a plurality of fins protruding over the substrate.

10. The method of claim 8, further comprising:
depositing a first hard mask layer over channel layer;
patterning the first hard mask layer to expose the first channel region;
forming the first delta doping layer over the first channel region through the first delta doping process;
applying a first diffusion process to the first delta doping layer;
removing the first hard mask layer;
depositing a second hard mask layer over the channel layer;
patterning the second hard mask layer to expose the second channel region;
forming the second delta doping layer over the second channel region through the second delta doping process;
applying a second diffusion process to the second delta doping layer; and
removing the second hard mask layer.

11. The method of claim 8, further comprising:
depositing the first delta doping layer over the first channel region using a metal organic chemical vapor deposition (MOCVD) process.

12. The method of claim 8, wherein:
the buffer layer is of a thickness in a range from about 100 nm to about 500 nm.

13. The method of claim 8, wherein:
the channel layer is of a thickness in a range from about 5 nm to about 20 nm.

14. The method of claim 8, wherein:
the first channel region is of a standard threshold voltage;
the second channel region is of a higher threshold voltage; and
the third channel region is of a lower threshold voltage.

15. A method comprising:
growing a buffer layer over a substrate;
growing a channel layer over the buffer layer, wherein the channel layer comprises:
   a first channel region;
   a second channel region, and wherein the first channel region and the second channel region are separated by a first isolation region; and
   a third channel region, and wherein the third channel region and the second channel region are separated by a second isolation region;
depositing a hard mask layer over the channel layer;
patterning the hard mask layer;
applying a first delta doping process to the first channel region to form a first delta doping layer over the first channel region, wherein a top surface of the first delta doping layer is exposed and a bottom surface of the first delta doping layer is in direct contact with a top surface of the first channel region;
applying a second delta doping process to the second channel region to form a second delta doping layer over the second channel region, wherein the second delta doping layer is of a different doping density from the first delta doping layer, and wherein a top surface of the second delta doping layer is exposed and a bottom surface of the second delta doping layer is in direct contact with a top surface of the second channel region; and
after the step of applying the first delta doping process and prior to the step of applying the second delta doping, applying a first diffusion process to the first delta doping layer and after the step of applying the first delta doping process, applying a second diffusion process to the second delta doping layer.

16. The method of claim 15, further comprising:
growing the buffer layer over the substrate through a first epitaxial growth process, wherein the buffer layer is formed of a compound semiconductor material comprising group III and group V elements.

17. The method of claim 15, further comprising:
growing the channel layer over the buffer layer through a second epitaxial growth process, wherein the channel layer is formed of a compound semiconductor material comprising group III and group V elements.

18. The method of claim 15, further comprising:
forming the first isolation region and the second isolation region, wherein:
   the first isolation region and the second isolation region divide the buffer layer into a first buffer region, a second buffer region and a third buffer region.

19. The method of claim 18, further comprising:
diffusing first dopants from the first delta doping layer into the first channel region and the first buffer region; and
diffusing second dopants from the second delta doping layer into the second channel region and the second buffer region.

20. The method of claim 15, wherein:
the first channel region is of a standard threshold voltage;
the second channel region is of a higher threshold voltage; and
the third channel region is of a lower threshold voltage.

* * * * *